United States Patent [19]
Kim et al.

[11] Patent Number: 6,037,267
[45] Date of Patent: Mar. 14, 2000

[54] METHOD OF ETCHING METALLIC FILM FOR SEMICONDUCTOR DEVICES

[75] Inventors: Sung-kyeong Kim; Hun Cha, both of Kyungki-do, Rep. of Korea

[73] Assignee: Samsung Electronics Co., Ltd., Suwon, Rep. of Korea

[21] Appl. No.: 09/116,483

[22] Filed: Jul. 16, 1998

[30] Foreign Application Priority Data

Jul. 25, 1997 [KR] Rep. of Korea ............ 97-35184

[51] Int. Cl.[7] .................................... H01L 27/00
[52] U.S. Cl. ............................ 438/720; 438/742
[58] Field of Search .................. 438/706, 714, 438/715, 720, 737, 738, 742; 216/67, 72, 75, 77, 79

[56] References Cited

U.S. PATENT DOCUMENTS

| | | |
|---|---|---|
| 4,771,730 | 9/1988 | Tezuka .............................. 156/345 X |
| 5,539,179 | 7/1996 | Nozawa et al. ................. 156/345 X |
| 5,556,500 | 9/1996 | Hasegawa et al. .............. 438/720 X |

*Primary Examiner*—William Powell
*Attorney, Agent, or Firm*—Jones Volentine, LLP

[57] ABSTRACT

There is provided a method of etching metallic film for a semiconductor device, in which a semiconductor substrate with a metallic film exposed in a film pattern is inserted onto a chuck in a chamber of an electrostatic shielded radio frequency (ESRF) inductive-coupled plasma source, the ESRF inductive-coupled plasma source also including a coil connected to an upper electrode, a lower electrode connected to the chuck, a gas supply assembly, a pressure control assembly and a temperature control assembly. An etching gas is supplied to the chamber at a predetermined etch gas supply rate. Pressure inside the chamber is maintained at a predetermined pressure level. The upper and lower electrodes are powered with predetermined upper and lower powers, respectively, at predetermined upper and lower RFs, respectively. The chamber walls are cooled to a predetermined temperature. The metallic film is etched such that trenches in the metallic film are formed with predetermined trench qualities including a predetermined trench critical dimension no greater than a critical dimension associated with large scale integration.

24 Claims, 1 Drawing Sheet

METHOD OF ETCHING METALLIC FILM FOR SEMICONDUCTOR DEVICES

BACKGROUND

1. Field of the Invention

The present invention relates to a method of etching metallic films for semiconductor devices, and more particularly, to a method of etching metallic films using plasma formed by electrostatic shielded radio frequency (ESRF) inductive-coupled plasma sources.

2. Description of the Related Art

Generally, during the fabrication of semiconductor devices, an etching process is performed in order to form patterns on a film deposited on a semiconductor substrate. The parameters of the etching process depend on the characteristics of the materials and structures designed for the semiconductor device. With more highly integrated semiconductor devices, the pitch, i.e., the horizontal spacing, of structures has become smaller, while the number of layers has increased, leading to the need for creating trenches through more layers. That is, there is a need for a decreased minimum pitch (critical dimension) and an increased aspect ratio (i.e., the ratio of depth of a trench to width of the trench) of the patterns formed in the films for integration scales beyond large scale integration (LSI). Productivity of the fabrication process also depends on etching rate, i.e., the depth of a film that can be etched in a unit of time.

To date, a variety of etching methods have evolved—from wet etching using chemicals, to several dry etching methods including using pure plasmas, reactive ion etching (RIE), magnetically enhanced reactive ion etching (MERIE), electron cyclotron resonance (ECR) plasmas, and electrostatic shielded radio frequency (ESRF) inductive coupled plasma sources.

The etching rates of most of these methods are limited by the depletion of etching agents in the vicinity of a film being etched as the etching progresses, a phenomenon called micro-loading. Micro-loading can be greatly affected by the rate at which reactive etching agents are supplied to the vicinity of the film and the rate at which products of the reaction are carried away.

Plasmas are generated in plasma chambers in which electrons of a source gas, such as air at normal pressure, are excited by radio frequency (RF) high voltages applied across two electrodes or induced by RF electric current flow in a coil. The excited electrons then collide with the molecules of an etching gas, i.e., a process gas, to produce ions and radicals. The ions and radicals then etch the film deposited on the substrate.

Pure plasma etching generates chemical agents including ions and radicals from a plasma of excited electrons so that the ions and radicals can react chemically with the film deposited on the substrate. The effectiveness of this type of etching depends greatly on the material being etched and so provides a high degree of selectivity, like chemical etching. For many materials this pure plasma etching proceeds in all directions, i.e., the etching is isotropic.

Reactive ion etching (RIE) further accelerates the ions and radicals toward the film to increase the kinetic energy of collisions between the reactive ions and radicals and the molecules of the film. This ionic bombardment increases the effectiveness of etching, especially in the direction of bombardment, generally perpendicular to the film. Therefore more directional, i.e. more anisotropic, etching occurs than with pure plasma etching. RIE also tends to depend less on the material of the film, i.e., RIE provides less selectivity than pure plasma etching. In a typical RIE device the RF is at 13.56 MegaHertz (MHz), and a capacitor in the grounding line allows a negative charge to accumulate on the walls of the chamber and the on the wafer. The negative charge repels electrons in an adjacent region called a sheath, and accelerates positive ions and radicals toward the walls and wafer.

Electron densities sufficient to produce ions and radicals can be achieved at low pressures by introducing a magnetic field that constrain the electrons to move in circular or helical trajectories as in MERIE. In ECR plasmas, the magnetic field strength is selected to produce a Lorenz force that causes circular or helical electron trajectories with a cyclotron frequency that matches the RF applied to the electrodes. In ECR plasmas, efficient coupling is obtained between the power applied to the electrodes and the energy given to the electrons. This is called resonant energy coupling, and usually uses a RF at 2.45 GigaHertz (GHz).

Independent plasma generation and ion acceleration is achieved in the inductive coupled plasma sources. In these devices, electrons are excited to form a plasma by an RF magnetic field induced by applying RF power to a helical coil. The plasma is constrained in a plasma region by the RF magnetic filed. A process gas is introduced into the chamber and is ionized by the plasma. A separate bias voltage is applied to the wafer to accelerate the ions and radicals into the wafer at steep angles. To reduce acceleration of plasma and ions and radicals into the walls of the chamber by secondary electric fields produced by the coil as a byproduct of the RF magnetic field, an ESRF inductive coupled plasma source provides a slotted cylindrical conductor around the wall of the chamber as an electrostatic shield. The electrostatic shield prevents the accumulation of charge on the chamber walls by shorting the fields directed perpendicular to the wall, which cause a capacitive coupling, to ground. A solid electrostatic shield would also block the propagation of RF electromagnetic waves into the chamber. However those waves are needed to establish the axial RF magnetic field. Therefore the shield is slotted to allow the RF electric fields to propagate that support the axial RF magnetic field desired, and that block the waves that provide perpendicular RF magnetic fields. In this arrangement ions and radicals can be accelerated into the wafer with less acceleration into the walls of the chamber, and the ions and radicals can be accelerated with a power independent of the plasma generating RF power. As a result low energy ion bombardment and high pressure operations are possible.

The desirability and efficiency of the plasma processes depend on many parameters such as the efficiency of electron excitation, the temperature, pressure and mix of gases that react with the electrons of the plasma to produce ions and radicals, the bias in the electric and magnetic fields that accelerate the ions and radicals onto the film, and the contaminating effects of plasma interactions with other surfaces in the plasma chamber such as the side walls of the plasma chamber. All these parameters can be varied almost continuously, so that extensive experimentation is required to determine what new combinations of parameters produce results that meet particular manufacturing design specifications. Such specifications include the selectivity for one film over another, the critical dimension, the aspect ratio of the resulting structures, the depth and steepness of the trench sides, i.e. the trench profile, and the etching rate.

As the complexity and integration of semiconductor devices continue to increase beyond LSI, limitations in the existing etching methods, such as low selectivity, poor anisotropy, micro-loading, and the difficulty in identifying new combinations of parameters with desirable results, inhibit the productivity of a fabrication facility. These problems are especially severe in the etching of metallic films for forming fine contact holes. The problems become worse as the number of different metallic layers in a metallic film increases.

The conventional processes for established semiconductor devices typically are not applicable to the new devices being designed and manufactured. As a result, the conventional etching processes cannot satisfy the modem trend toward highly-integrated semiconductor devices beyond LSI devices, and so these conventional etching processes limit the utility and reliability of fabrication facilities.

SUMMARY OF THE INVENTION

The present invention is directed to provide a method of etching metallic film on a semiconductor substrate in order to satisfy the manufacturing specifications for the modem, highly integrated semiconductor devices beyond large scale integration (LSI) devices.

To achieve these and other advantages, there is provided a method of etching metallic film for a semiconductor device in which a semiconductor substrate with a metallic film exposed in a film pattern is inserted onto a chuck in a chamber of an electrostatic shielded radio frequency (ESRF) inductive-coupled plasma source, the ESRF inductive-coupled plasma source also including a coil connected to an upper electrode, a lower electrode connected to the chuck, a gas supply assembly, a pressure control assembly and a temperature control assembly. An etching gas is supplied to the chamber at a predetermined etch gas supply rate. Pressure inside the chamber is maintained at a predetermined pressure level. The upper and lower electrodes are powered with predetermined upper and lower powers, respectively, at predetermined upper and lower RFs, respectively. The chamber walls are cooled to a predetermined temperature. The metallic film is etched such that trenches in the metallic film are formed with predetermined trench qualities including a predetermined trench critical dimension no greater than a critical dimension associated with large scale integration.

In other aspects of the method, the metallic film includes aluminum, and the etching gas includes chlorine supplied at a rate in a range from about 30 cc/min to about 100 cc/min mixed with boron trichloride supplied at a rate less than about 100 cc/min. In still other aspects, a pressure is maintained at a predetermined pressure in the range from about 3 milliTorr (mTorr) to about 15 mTorr, and a temperature is maintained at a predetermined temperature in the range from about 30° C. to about 50° C.

BRIEF DESCRIPTION OF THE DRAWINGS

The present invention is described with reference to the accompanying drawings in which.

DETAILED DESCRIPTION OF THE PREFERRED EMBODIMENTS

Figure 1:
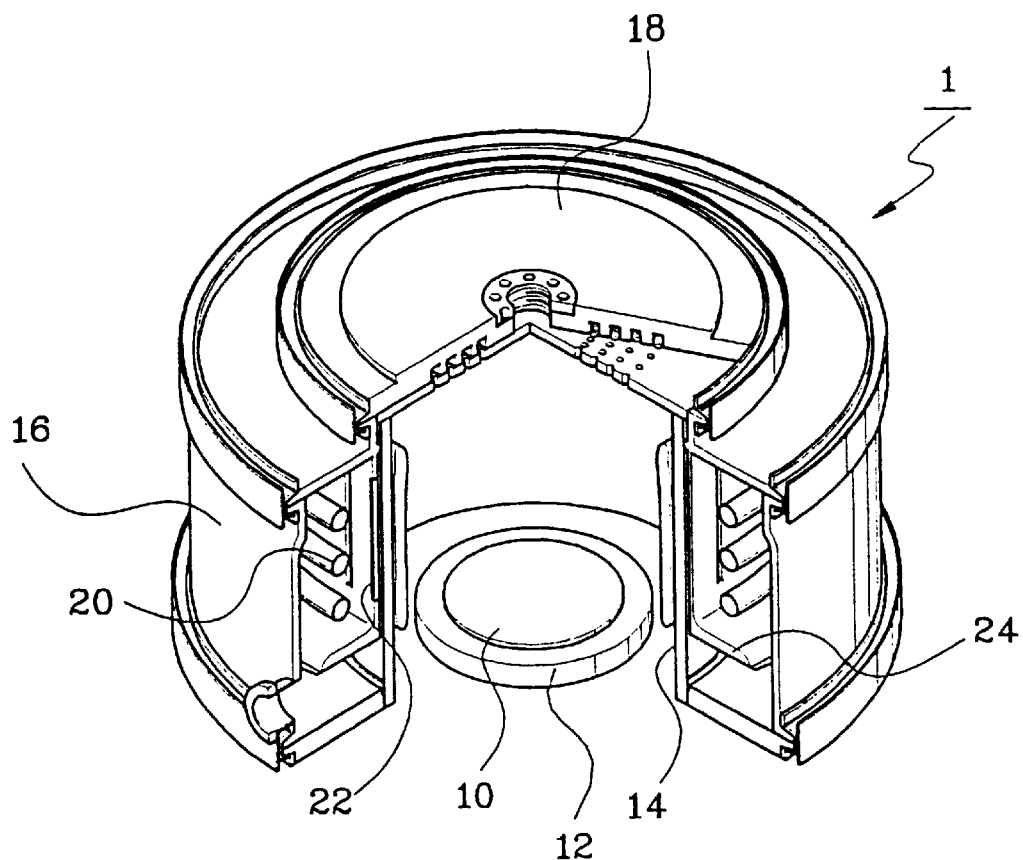
FIG. 1 is a cut away perspective view of the ESRF inductive-coupled plasma source used in the etching process according to the present invention.
Figure 2:
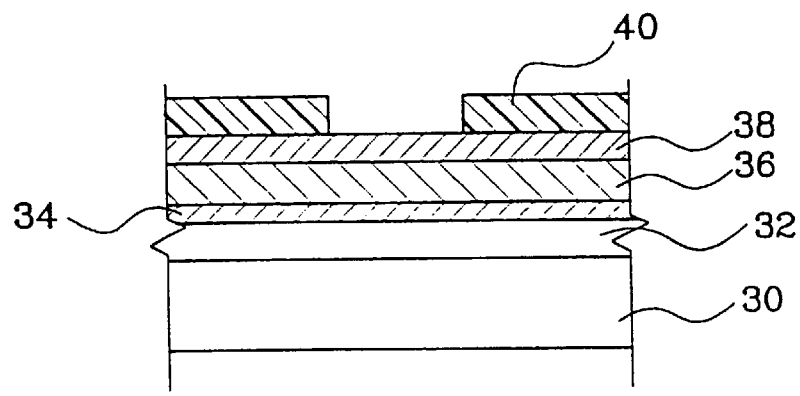
FIG. 2 is a cross-sectional view showing a multi-layered metallic film on a semiconductor substrate that is etched where exposed by a photoresist pattern according to the present invention.

The invention is here described in terms of examples including the preferred embodiment with reference to FIG. 1 and FIG. 2.

FIG. 1 shows a chamber 1 of an electrostatically shielded radio frequency (ESRF) inductive-coupled plasma source. The source has a chuck 12 placed inside the chamber 1 for mounting a semiconductor substrate such as a wafer 10 in the chamber 1. The chuck 12 is electrically powered through a lower electrode (not shown). The chamber 1 has substantially concentric cylindrical inner wall 14 and outer wall 16. The chamber 1 has a gas supply assembly including a cover 18 attached to the top of the inner wall with holes a certain distance apart from each other to supply gases into the chamber 1. The chamber 1 also includes a floor (not shown) which is connected to the bottom of the inner wall 14. The cover 18, inner wall 14, and floor are connected so that a predetermined pressure can be maintained between them in a plasma region as part of a pressure control assembly. The inner wall 14 is formed with non-conductive material such as quartz or ceramic, or other insulating material; and the outer wall 16 is formed with conductive material.

The chamber 1 also includes a helical coil 20 powered through an upper electrode (not shown). The helical coil is disposed in the space between the inner wall 14 and the outer wall 16 so that the central axis of the coil is substantially concentric with the central axis of the inner wall 14 and the outer wall 16.

An electrostatic shield 22 is installed in the inner wall 14. Also installed between the inner wall 14 and the outer wall 16, below the coil 20, is a cooler 24 in contact with the inner wall 14 to cool the inner wall 14, as part of a temperature control assembly.

The plasma is formed in the plasma region of the chamber of the ESRF inductive-coupled plasma source. Gas, such as etching gas and supplemental gas, is supplied through the holes of the cover 18 to provide both electrons for the plasma and ions and radicals for etching the film on the wafer 10. The upper electrode and the lower electrode 26 are driven at specified RFs, for example, both at 13.56 Mega Hertz (MHz). The coil RF power supplied to the upper electrode excites the electrons to escape the molecules of at least one species of the gases (either one species of the etching gas or one of the supplemental gas) thus forming the plasma. The coil RF power also constrains the electrons to orbit in a plasma region away from the chuck 12. The electrons of the plasma then interact with other species of the etching gas to form ions and radicals. The chuck RF power supplied to the lower electrode then accelerates the ions and radicals onto the semiconductor substrate such as the wafer 10 to etch trenches into the exposed metal film.

The ESRF inductive-coupled plasma source allows the user to establish predetermined pressures and temperatures of operation that can significantly affect etching rates and selectivity. Predetermined temperatures are attained by cooling using the cooler 24 disposed between the inner wall 14 and the outer wall 16. The cooler 24 passes a cooling fluid such as liquid helium to absorb heat from the plasma region of the chamber 1 through the inner wall 14.

The method of etching metallic film according to the present invention uses plasma formed by the ESRF inductive-coupled plasma source of FIG. 1 to etch a metallic film. Referring to FIG. 2, a metallic film may include several layers 34, 36 and 38 of different metals. A photoresist 40 is formed as an etching mask pattern on the metallic film layers 34, 36, 38, which themselves are deposited on an oxide film 32 on the semiconductor substrate 30. By properly choosing the etching gas, pressure, and temperature, the selectivity can be varied so that the various metallic layers are completely etched away while the photresist is not completely etched and the underlying oxide film is not substantially etched. The anistropy supplied by the ESRF inductive-coupled plasma source can be tuned by varying power to the upper and lower electrodes to allow one etching process to form deep trenches in several metallic layers of the metallic film with reduced undercutting so that steep sided profiles can be obtained.

In example embodiments of the method of the present invention, the metallic film is an aluminum (Al) film. In the preferred embodiment, the metallic film is multi-layered with a layer of titanium (Ti) 34 underlying a layer of aluminum (Al) 36, itself underlying a layer of titanium nitride (TiN) 38. In the example embodiments, the Al film 36 includes about 0.8% to 1.2% of silicon (Si) and may also include about 0.4% to 0.6% of copper (Cu). In the preferred embodiment, the Al layer 36 has 0.8 to 1.2% of Si but substantially no copper.

In the preferred embodiment, the main etching gas is a mixture of boron trichloride ($BCl_3$) gas and chlorine ($Cl_2$) gas; but, $Cl_2$ gas could be used alone. According to an embodiment of the present invention, the $BCl_3$ gas is supplied at a rate less than about 100 cubic centimeters per minute (cc/min), and the $Cl_2$ gas is supplied at a rate of about 30 to 100 cc/min. In the preferred embodiment, $BCl_3$ gas and $Cl_2$ gas are supplied at the rate of 80 cc/min each. These etching gases become electrolytic dissociated in the plasma and the electrolytic ions and radicals react chemically with the metallic film.

Nitrogen ($N_2$) gas can be supplied as a supplementary gas, besides the main etching gas, and at a rate of about 5 to 30 cc/min. It is supplied at the rate of 10 cc/min in the preferred embodiment. The role of the supplementary gas is to provide electrons for the plasma or to bind with the chemical products of etching to form chemical species that can be more easily removed from the wafer than the chemical products of etching themselves. The supplementary gas can reduce the effects of microloading.

According to another embodiment of the present invention, the etching process is carried out at low pressures with the pressure maintained at a predetermined level in the range from about 3 to 15 milliTorr (mTorr). In the preferred embodiment, the predetermined pressure is maintained at about 5 mTorr. The low pressure is maintained to prevent loss of bombarding energies of the ions and radicals by reducing interactions between gas molecules and to evacuate products of the reactive etching.

According to another embodiment of the present invention, the etching process is performed at a temperature in the range from about 30 to 50° C., by cooling. In the preferred embodiment, the temperature is cooled to about 40° C. by passing liquid helium through the cooler 24.

In another embodiment of the present invention, the power applied to the upper electrode can be greater than the power applied to the lower electrode. The source power applied to the upper electrode should be in the range from about 700 to 3500 W, and the bottom power applied to the lower electrode should be less than 500 W. In the preferred embodiment, the source power is about 800 W, and the bottom power is about 120 W.

The present invention provides the conditions for forming trenches in all layers 34, 36, 38 of the multi-layered metallic film including aluminum, without etching away the photoresist, without too much diluting of the reactive agents, and without contamination from the inner wall 14. That is, trenches can be formed that meet the design specifications for critical dimension, anisotropy, trench profile, selectivity, and micro-loading. Thus the etching process of the present invention satisfies the design specifications to fabricate the fine patterns of modern, highly integrated, complex semiconductor devices.

Now the functions and effects of a concrete embodiment of the present invention are illustrated in detail with reference to FIG. 2. First, the oxide film 32 is deposited on the semiconductor substrate 30 of a wafer 10, and then the Ti layer 34, the Al layer 36, and the TiN layer 38 of the metallic film are successively deposited. In order to form a designed pattern of trenches in the metallic film, a photoresist 40 layer is formed on the TiN layer 38, the uppermost metallic layer, and then photolithography is carried out on the photoresist to form an etching mask that exposes the metallic film in the designed pattern.

Then the metallic film etching process operates on the exposed metallic film 34, 36, 38 as patterned. The wafer 10 with the semiconductor substrate 30, oxide layer 32, and metallic film 34, 36, 38 is mounted in the chamber 1 on the chuck 12. A plasma is formed in the chamber of an ESRF inductive-coupled plasma source with the source power (i.e. an upper power) of the upper electrode at 800 W, and the lower power of the lower electrode at 120 W. Then the main etching gas, a mixture of $BCl_3$ gas and $Cl_2$ gas each supplied at the rate of 80 cc/min, is introduced into the chamber 1. At the same time, supplementary $N_2$ gas is supplied at the rate of 10 cc/min. The chamber is maintained at a pressure of 5 mTorr and cooled to a temperature of 40° C. In order to maintain 40° C. of temperature, the chamber 1 uses a cooler 24 with liquid helium (He) supplied with 12 Torr of pressure.

Accordingly, Cl ion and Cl radical are generated from the ionized chlorine gas by the plasma. The Cl radical reacts with the layers 34, 36, 38 of the metallic film in order to etch through all three layers. In addition, the $BCl_3$ gas is also ionized by the plasma and reacts with the layers 34, 36, 38 of the metallic film in order. The $N_2$ gas controls the etching rate during the etching process and improves the profiles of the pattern formed by the etching process.

The specific conditions described for the concrete example are considered optimum for the anisotropic etching of a metallic film having layers of titanium, aluminum, and titanium nitride using a patterned photoresist as a mask. If the etching process is carried out within the wider ranges of the processing conditions for the present invention, as described preceding the concrete example, the present invention should satisfy modern specifications of an etching process for a multi-layered metallic film, including selectivity and anisotropy, at critical dimensions smaller than those associated with LSI devices.

Therefore, the present invention can be effectively applied during modern, more highly integrated semiconductor device fabrication that is more demanding in terms of the critical dimension of fine patterns formed, and more complex in terms of design specifications. Thus the present invention provides increased reliability for modern semiconductor device fabrication.

While the present invention has been described in detail, it should be understood that one of ordinary skill in the art can make various changes, substitutions and alterations without departing from the spirit and scope of the invention as defined by the appended claims and their equivalents.

What is claimed is:

1. A method of etching metallic film for a semiconductor device, comprising:

inserting a semiconductor substrate with a metallic film exposed in a film pattern onto a chuck in a chamber of an electrostatic shielded radio frequency (ESRF) inductive-coupled plasma source, the ESRF inductive-coupled plasma source also including a coil connected to an upper electrode, a lower electrode connected to the chuck, a gas supply assembly, a pressure control assembly and a temperature control assembly;

supplying an etching gas to the chamber at an etch gas supply rate;

maintaining pressure inside the chamber at a pressure level;

powering the upper electrode with an upper power at an upper RF;

powering the lower electrode with a lower power at a lower RF;

cooling the chamber walls to a temperature; and etching the metallic film such that trenches in the metallic film are formed with trench qualities including a trench critical dimension no greater than a critical dimension associated with large scale integration.

2. The method of claim 1, wherein during said etching the metallic film is an aluminum film.

3. The method of claim 2, wherein during said inserting the aluminum film includes silicon in an amount in a range from about 0.8% to about 1.2%.

4. The method of claim 3, wherein during said inserting the aluminum film includes copper in an amount in a range from about 0.4% to about 0.6%.

5. The method of claim 1, wherein during said inserting the metallic film is a multi-layered metallic film including an aluminum layer.

6. The method of claim 5, wherein during said inserting the multi-layered metallic film further includes a titanium layer and a titanium nitride (TiN) layer.

7. The method of claim 6, wherein during said inserting the titanium layer is below the aluminum layer and the aluminum layer is below the TiN layer.

8. The method of claim 1, wherein, during said supplying the etching gas, the etching gas includes chlorine ($Cl_2$).

9. The method of claim 8, wherein during said supplying the etching gas, the etching gas includes boron trichloride ($BCl_3$).

10. The method of claim 9, wherein, during said supplying the etching gas, the etch gas supply rate includes a $BCl_3$ rate less than about 100 cc/min and a $Cl_2$ rate in a range from about 30 cc/min to about 100 cc/min.

11. The method of claim 1, further comprising, before said etching, supplying a supplementary gas at a supplemental gas rate.

12. The method of claim 11, wherein, during said supplying the supplementary gas, the supplementary gas is nitrogen ($N_2$).

13. The method of claim 12, wherein during said supplying the supplementary gas, the supplemental gas rate is in a range from about 5 cc/min to about 30 cc/min.

14. The method of claim 1, wherein, during said maintaining pressure, the pressure level is in a range from about 3 mTorr to about 15 mTorr.

15. The method of claim 1, wherein during said powering the upper electrode and said powering the lower electrode, the upper RF and the lower RF are about 13.56 MegaHertz.

16. The method of claim 15, wherein during said powering the upper electrode, the upper power is in a range from about 700 Watts to about 3500 Watts.

17. The method of claim 15, wherein during said powering the lower electrode, the lower power is less than about 500 Watts.

18. The method of claim 1, wherein, during said cooling, the temperature is in a range from about 30° C. to about 50° C.

19. The method of claim 1, wherein during said etching the metallic film, only an exposed portion of the metallic film is etched.

20. The method of claim 19, wherein during said inserting, the metallic film is an aluminum film.

21. The method of claim 20, wherein, during said supplying the etching gas:

the etching gas includes Chlorine ($Cl_2$) and Boron trichloride ($BCl_3$); and the etch gas supply rate includes a $Cl_2$ rate of about 80 cc/min and a $BCl_3$ rate of about 80 cc/min.

22. The method of claim 21, wherein:

the pressure level is about 5 mTorr during said maintaining pressure; and the temperature is about 40° C. during said cooling.

23. The method of claim 22, wherein:

during said powering the upper electrode, the upper power is about 800 Watts and the upper RF is about 13.56 MegaHertz; and during said powering the lower electrode, the lower power is about 120 Watts and the lower RF is about 13.56 MegaHertz.

24. The method of claim 23, further comprising, before said etching, supplying a supplementary gas at a supplemental gas rate, wherein the supplementary gas is nitrogen ($N_2$) and the supplemental gas rate is in a range from about 5 cc/min to about 30 cc/min.

* * * * *